US008041861B2

(12) United States Patent
Lee

(10) Patent No.: US 8,041,861 B2
(45) Date of Patent: *Oct. 18, 2011

(54) MEMORY DEVICE COMMUNICATING WITH A HOST AT DIFFERENT SPEEDS AND MANAGING ACCESS TO SHARED MEMORY

(75) Inventor: Kee-Hoon Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 184 days.

This patent is subject to a terminal disclaimer.

(21) Appl. No.: 12/538,362

(22) Filed: Aug. 10, 2009

(65) Prior Publication Data

US 2009/0300236 A1 Dec. 3, 2009

Related U.S. Application Data

(63) Continuation-in-part of application No. 12/202,882, filed on Sep. 2, 2008, now abandoned, which is a continuation of application No. 11/433,367, filed on May 12, 2006, now Pat. No. 7,441,056.

(30) Foreign Application Priority Data

May 27, 2005 (KR) .............................. 2005-0045211

(51) Int. Cl.
G06F 3/00 (2006.01)
G06F 13/00 (2006.01)

(52) U.S. Cl. ................... 710/62; 710/8; 710/9; 710/10; 710/38; 710/316

(58) Field of Classification Search ................ 710/8–10, 710/62, 60
See application file for complete search history.

(56) References Cited

U.S. PATENT DOCUMENTS

| 6,052,739 | A  | * | 4/2000  | Bopardikar et al. | .......... 719/321 |
| 6,119,196 | A  | * | 9/2000  | Muller et al.     | ................. 710/243 |
| 6,199,150 | B1 | * | 3/2001  | Yoshikawa         | .................... 711/170 |
| 6,707,818 | B1 | * | 3/2004  | Kadambi et al.    | ............... 370/391 |
| 7,151,893 | B2 | * | 12/2006 | Hayashi et al.    | .................... 398/7 |
| 2006/0187837 | A1 | * | 8/2006 | Warren et al.    | ................. 370/235 |
| 2006/0282567 | A1 | * | 12/2006 | Bhesania et al. | ................ 710/52 |

* cited by examiner

*Primary Examiner* — Tammara Peyton
(74) *Attorney, Agent, or Firm* — F. Chau & Associates, LLC

(57) ABSTRACT

A memory device includes a high speed port, a low speed port, at least a first memory bank, a first register, and a multiplexer. The at least first memory bank is shared by the high speed port and the low speed port. The first register store information that indicates which one of the ports has permission to access the first memory bank. The multiplexer connects one of the high speed port or the low speed port to the first memory bank, in response to the information stored in the first register.

17 Claims, 10 Drawing Sheets

FIG. 4

| Register Name | Type | Size | Description |
|---|---|---|---|
| Semaphore | READ/WRITE (A-port & B-port) | 1bit | To indicate authority to access shared bank<br>DQ[0] : 0 = A-port, 1 = B-port (Default)<br>Semaphore register can be writen only by the port which has access authority |
| Mailbox_AB | WRITE (A-port)<br>READ (B-port) | 32bit | To transfer message from A-port to B-port<br>$\overline{\text{INT}}$ b goes low when A-port writes data on Mailbox_AB |
| Mailbox_BA | WRITE (B-port)<br>READ (A-port) | 32bit | Transfer message from B-port to A-port<br>$\overline{\text{INT}}$ a goes low when B-port writes data on Mailbox_BA |
| Check_AB | READ (A-port) | 1bit | To indicate whether the message written to Mailbox_AB by A_port is read though B-port, or not. Check_AB register value is automatically changed depending on READ/WRITE commnd to be issued to Mailbox_AB register.<br>DQ[0] : 1 = When A-port issues WRITE to Mailbox_AB<br>0 = When B-port issues READ to Mailbox_AB (Default) |
| Check_BA | READ (B-port) | 1bit | To indicate whether the message written to Mailbox_BA by B_port is read though A-port, or not. Check_BA register value is automatically changed depending on READ/WRITE commnd to be issued to Mailbox_BA register.<br>DQ[0] : 1 = When B port issues WRITE to Mailbox_BA<br>0 = When A-port issues READ to Mailbox_BA (Default) |

MEMORY DEVICE COMMUNICATING WITH A HOST AT DIFFERENT SPEEDS AND MANAGING ACCESS TO SHARED MEMORY

CROSS-REFERENCE TO RELATED PATENT APPLICATIONS

This application is a continuation-in-part of U.S. patent application Ser. No. 12/202,882, filed on Sep. 2, 2008 now abandoned, which is a continuation of U.S. patent application Ser. No. 11/433,367, filed on May 12, 2006 now U.S. Pat. No. 7,441,056, which, in turn, claims foreign priority under 35 U.S.C. §119 to Korean Patent Application No. 2005-0045211, filed on May 27, 2005, in the Korean Intellectual Property Office, the disclosures of which are incorporated by reference herein in their entireties.

BACKGROUND OF THE INVENTION

1. Technical Field

Embodiments of the present invention relate to a memory device, and more particularly, to a memory device capable of communicating with hosts at different speeds, a data communication system using the memory device, and a memory device that communicates with a host at different speeds and manages access to shared memory.

2. Discussion of Related Art

Due to the diversification in application environments of memory devices, and the increasing capacity and speed of memory devices, the data transmission speed and data throughput between hosts, such as memory controllers, and memory devices, continues to increase as well. With increased transmission speed and data throughput rates, it becomes more challenging to ensure the signal integrity of data transmitted and received to and from these memory devices.

In data communication, since data reception and transmission speed influences the topology of connecting hosts with memory devices, a limitation exists in the number of Dual In line Memory Modules (DIMMS) which each channel can support in a system requiring a high capacity memory. In order to remove the limitation, a FB (Fully Buffered)-DIMM structure is adopted.

FIG. 1 is a block diagram of a conventional memory device 100 including a high speed port interface (HSP I/F) 110.

Referring to FIG. 1, the memory device 100 includes a high speed port interface (HSP I/F) 110, a high speed data communication block 120, an operation setting block 130, and a control logic 140.

The high speed port interface 110 includes a high speed port 111 and a high speed data input/output circuit 112 to perform an interface function of communicating with a host at a high speed. The high speed port 111 is a pin of the memory device 100, and the high speed data input/output circuit 112 performs data synchronization between the host and the high speed data communication block 120.

The high speed data communication block 120 is used for high speed data communication, and includes functional blocks 121, a data interface 122, and a memory cell 123.

The operation setting block 130 includes a Phased Locked Loop (PLL) 131, a temperature sensor 132, and a status register 133, to control the operation of the memory device 100.

The control logic 140 controls the operations of the high speed data communication block 120 and the operation setting block 130. Data can be input to or output from the control logic 140 directly through the high speed port interface 110 or through the high speed port interface 110 and the functional blocks 121.

A memory device for FB-DIMM includes a buffer. In FIG. 1, the high speed port interface 110 corresponds to a buffer. Control signals and data signals used for data communication between a host and the memory device 100 are received or transferred through the buffer 110. In order to improve the performance of a system with a FB-DIMM structure, it is necessary to increase the data reception/transmission speed between the host and the buffer 110, between the buffer 110 and the high speed data communication block 120, and between the control logic 140 and both the high speed data communication block 120 and the operation setting block 130 of the memory device 100.

However, control signals and data signals do not necessarily need to travel at high speeds between the memory device 100 and the host. For example, when data having information regarding operation setting conditions of the memory device 100 is written to or read from a predetermined area of the operation setting block 130 of the memory device 100, the accuracy of the data is more important than the speed at which the data is written or read.

The information regarding the operation setting conditions of the memory device 100 may include operation mode, temperature sensor status, and error flags. Information regarding operation setting conditions of a memory device is essential for memory devices engaged in high speed data communication.

The high speed data communication block 120 includes a plurality of functional blocks for interfacing. For example, the high speed data communication block 120 includes interface functional blocks corresponding to the number of signal lines required for high speed data communication, and interface functional blocks required for receiving or transmitting data from or to the operation setting block 130.

The high speed port interface 110 interfaces with the high speed data communication block 120. This means that there is a dedicated interface for handling the input and output of high speed communications. However, such a dedicated interface occupies a large area on a circuit and can often have a high rate of power consumption. Therefore, it is inefficient in terms of layout size and power consumption to use an interface dedicated to high speed communications to write or read information that does not require high speed communication.

Thus, there is a need for memory devices that can communicate with hosts at different speeds. However, such a host may attempt to access a same memory bank of the memory device at the same time. Thus, there is a further need for a memory device that can communicate with hosts at different speeds while managing access to shared memory.

SUMMARY OF THE INVENTION

According to an exemplary embodiment of the present invention, there is provided a memory device which includes a high speed port interface and a low speed port interface. The high speed port interface transmits and receives data to and from a host at a high speed, while the low speed port interface transmits and receives data to and from the host at a low speed.

According to another exemplary embodiment of the present invention, there is provided a data communication system which includes a memory device, and a memory controller. The memory controller transmits and receives data to and from the memory device at two or more different speeds.

According to another exemplary embodiment of the present invention, there is provided a memory device including a high speed port, a low speed port, at least a first memory bank, a first register, and a multiplexer. The at least first memory bank is shared by the high speed port and the low speed port. The first register stores information that indicates which one of the ports has permission to access the first memory bank. The multiplexer connects one of the high speed port or the low speed port to the first memory bank, in response to the information stored in the first register.

According to another exemplary embodiment of the present invention, there is provided a memory device including a high speed port interface, a data communication block, a low speed port interface, a operation setting block, at least a first memory bank, a first register, and a multiplexer. The high speed port interface exchanges data with a host at a high speed. The data communication block exchanges high speed data with the host through the high speed port interface. The low speed port interface exchanges data with the host at a low speed. The operation setting block maintains operating setting conditions of the memory device and exchanges low speed data with the host through the low speed port interface. The at least first memory bank is shared by the high speed port interface and the low speed port interface. The first register stores information that indicates which one of port interfaces has permission to access the first memory bank. The multiplexer connects one of the high speed port interface or the low speed port interface to the first memory bank, in response to the information stored in the first register.

BRIEF DESCRIPTION OF THE DRAWINGS

The present invention will become more apparent by describing in detail exemplary embodiments thereof with reference to the attached drawings in which:

FIG. 4 is a table that provides exemplary descriptions of registers of the memory device of FIG. 3.

DETAILED DESCRIPTION OF EXEMPLARY EMBODIMENTS

Figure 1:
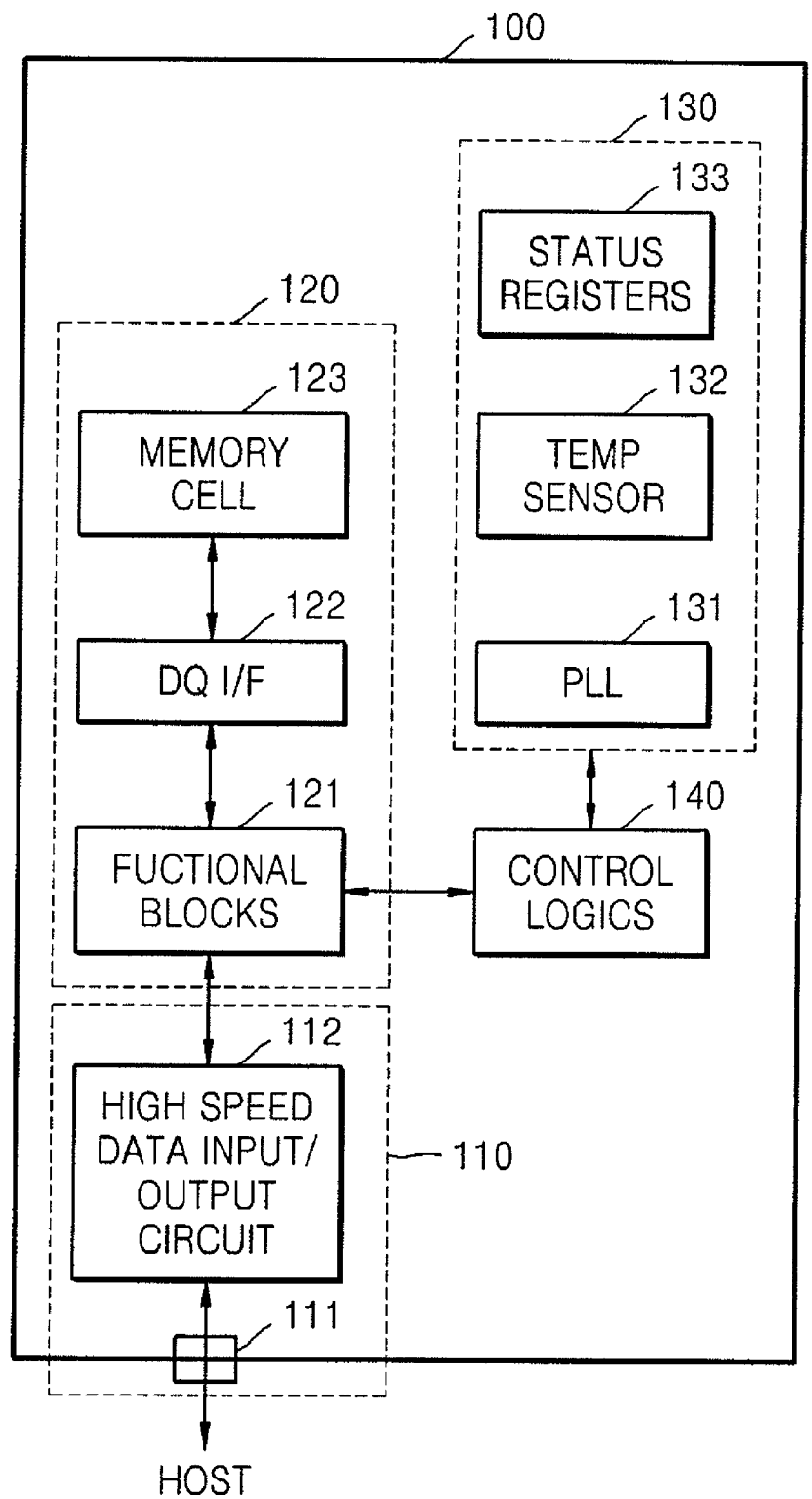
FIG. 1 is a block diagram of a conventional memory device including a high speed port interface.

Hereinafter, exemplary embodiments of the present invention will be described in detail with reference to the accompanying drawings. Like reference numerals in the drawings denote like elements, and thus their descriptions will not be repeated.

An exemplary embodiment of the present invention provides a memory device which includes a high speed data communication port, a low speed data communication port, and a low speed data input/output circuit connected to the low speed data communication port.

The low speed data communication port can receive information from external hosts on operation mode, temperature sensors t, error flags, etc.

Figure 2:
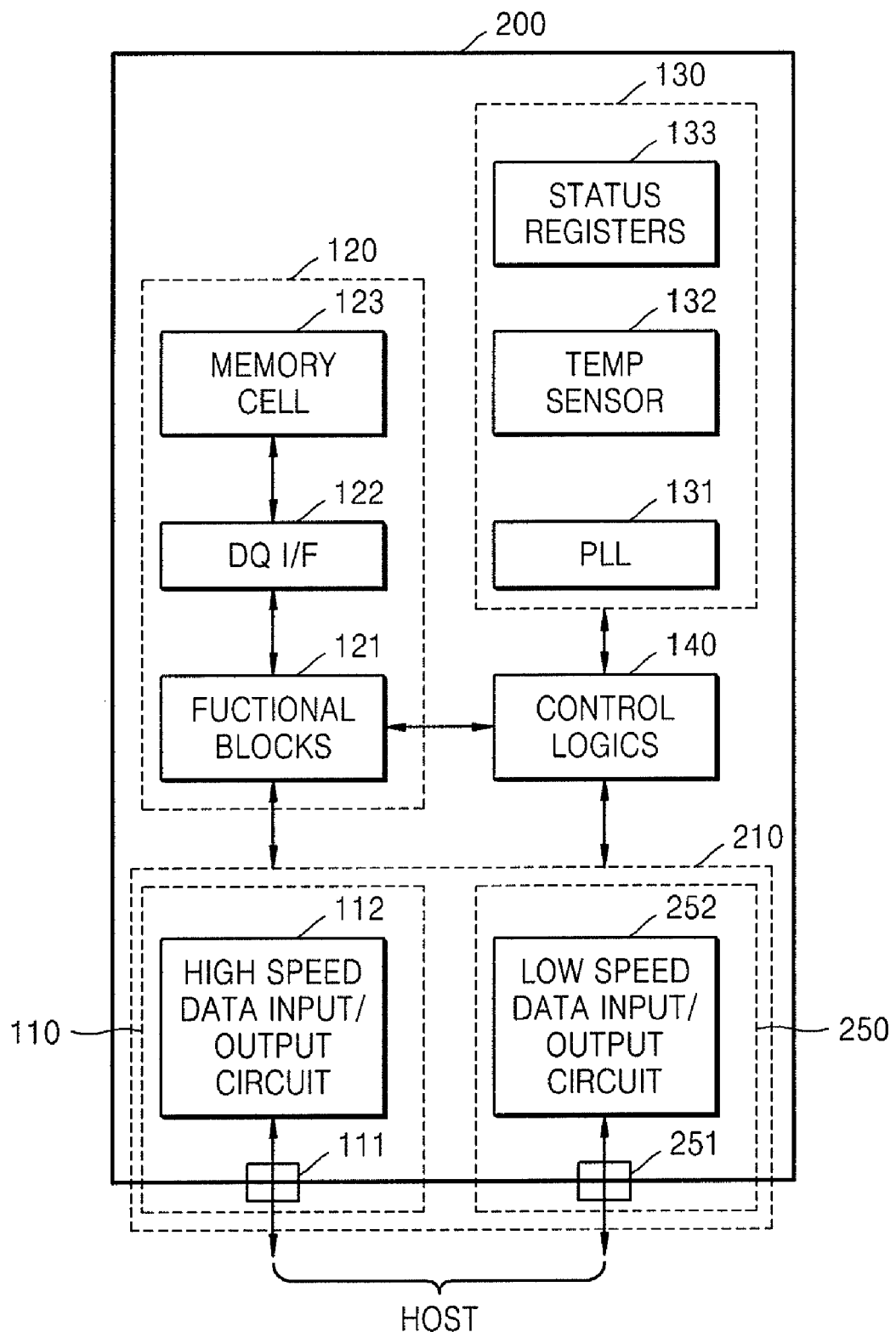
FIG. 2 is a block diagram of a memory device including a low speed port interface according to an exemplary embodiment of the present invention.

FIG. 2 is a block diagram of a memory device 200 which includes a port interface 210, a first data communication block 120, a operation setting block 130 and a control logic 140 according to an exemplary embodiment of the invention.

The port interface 210 includes a high speed port interface (HSP I/F) 110 and a low speed port interface (LSP I/F) 250. The high speed port interface (HSP I/F) 110 includes a high speed port 111 and a high speed data input/output circuit 112. The high speed port 111 is a pin of the memory device 200. The high speed data input/output circuit 112 is connected to the high speed port 111 and interfaces data between a host and the data communication block 120. The low speed port interface (LSP I/F) 250 includes a low speed port 251 and a low speed data input/output circuit 252. The low speed port 251 is a pin of the memory device 200. The low speed data input/output circuit 252 is connected to the low speed port 251. The low speed data input/output circuit 252 interfaces data between the host and the data communication block 120 or between the host and the operation setting block 130.

The data communication block 120 includes functional blocks 121, a data interface 122, and a memory cell 123. The functional blocks 121 are used to perform coding, decoding, conversion of parallel data into serial data, conversion of serial data into parallel data, etc. The data interface 122 connects the memory cells 123 with the functional blocks 121. The memory cell 123 is used to input, store, and output information used for data communication.

The operation setting block 130 includes a Phase Locked Loop (PLL) 131, a temperature sensor 132, and a status register 133. The temperature sensor 132 outputs temperature sensor information of the memory device 200. The status register 133 outputs operation mode setting information, error flag information of received or transmitted data, etc.

The control logic 140 controls the operations of the data communication block 120 and the operation setting block 130.

Data which includes information on operation mode of the memory device 200, temperature sensors, and error flag information of received or transmitted data, are received or transmitted between the operation setting block 130 and the host. Errorless reception and transmission of such data is more important than the speed at which the data travels. Since a probability of generating errors in data received or transmitted is higher in high speed data communication, an exemplary embodiment of the present invention makes it possible to increase the accuracy of data reception and transmission and significantly reduce the probability of error generation.

Although not shown in the drawings, a data communication system including a host for data communication can be easily implemented by utilizing the memory device 200 according to an exemplary embodiment of the present invention. The host may include control units, such as a CPU, a memory controller, etc., for performing predetermined operations through a memory device. The host may further include ports corresponding to the low speed port 251 and the high speed port 111 of the memory device 200 for performing high speed and low speed data communication with the memory device. If two or more hosts perform high speed and low speed data communication with the memory device 200 according to an exemplary embodiment of the present invention, each host may include at least one corresponding port.

An exemplary embodiment of the invention relates to a data communication memory device having two different speeds, a high speed and a low speed, however, the present invention can be also applied to data communication memory devices having a plurality of different speeds.

A memory device according to an exemplary embodiment of the present invention can perform high speed data communication through a high speed data communication interface, and can receive or transmit data at a low speed, where accuracy is preferred over speed through a low speed data communication interface.

Figure 3:
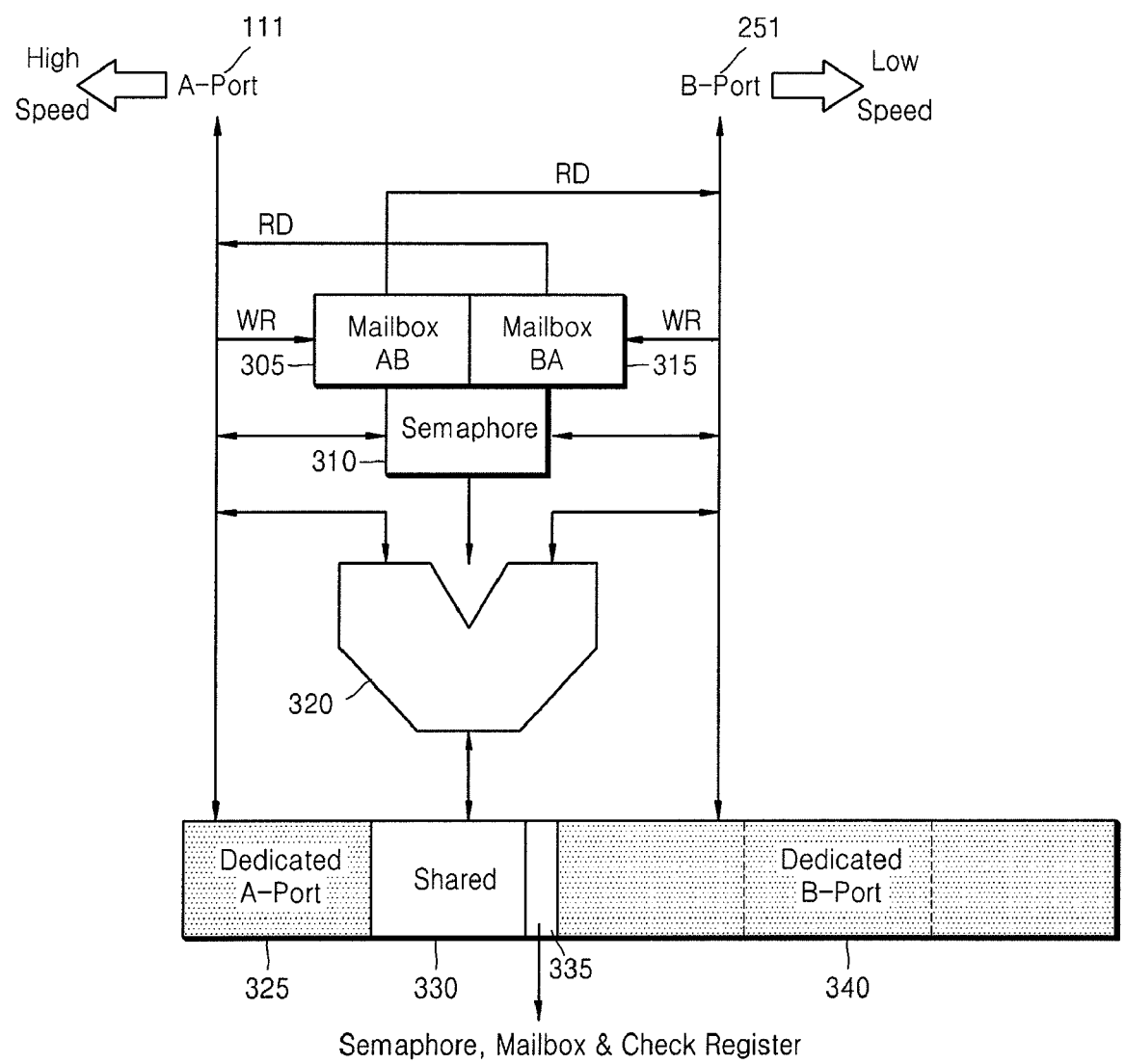
FIG. 3 is a block diagram of a memory device that includes a shared memory bank and manages access by a low speed port and a high speed port to the shared memory bank according to an exemplary embodiment of the present invention.

FIG. 3 is a block diagram of a memory device according to an exemplary embodiment of the present invention. Referring to FIG. 3, the memory device includes the high speed port 111 denoted as an 'A-port', the low speed port 251, denoted as a 'B-Port', a first mailbox register AB 305, a second mailbox register BA 315, a semaphore register 305, a multiplexer 320, and a shared memory bank 330. The memory device may further include check registers.

The memory device enables at least one shared memory bank (e.g., the shared memory bank) to be shared by the high speed port 111 and the low speed port 251. Information stored in the semaphore register 310 indicates which one of the ports has permission to access the memory bank 330. The multiplexer 320 connects one of the high speed port 111 or the low speed port 251 to the memory bank 330, in response to the information stored in the semaphore register 330. The port having permission to access the shared memory bank has permission to change the information of the semaphore register 310. The port not having permission does not have permission to change the information of the semaphore register 310. The port having permission to access the shared memory bank 330 can return permission to the other port by changing the information of the semaphore register 310. Both the high speed port 111 and the low speed port 251 have permission to read the information of the semaphore register 310. The first mailbox register AB 305 may temporally store a message from the high speed port 111 to the low speed port 251. The second mailbox register BA 315 may temporally store a message from the low speed port 251 to the high speed port 111.

The memory device may include memory and/or memory banks that may be dedicated separately to each of the individual high and low speed ports 111 and 251. For example, FIG. 3 illustrates a first memory bank 325, which may be dedicated to the high speed port 111 and a second memory bank 340, which may be dedicated to the low speed port 251. The memory of the memory device may further provide storage 335 to store data of the first mailbox register AB 305, the second mailbox register BA 315, the semaphore register 310, and the check register. The storage 335 may reside in a memory bank or a part of a memory bank.

FIG. 4 is a table that provides exemplary descriptions of the registers of the memory device of FIG. 3. Referring to FIG. 4, the semaphore register 310 may be used to indicate an authority to access (i.e., an access authority) the shared memory bank 330. The semaphore register 310 may have a size of one bit to differentiate between access to the high and low speed ports 111 and 251. For example, setting the semaphore register 310 to 0 may be used to indicate that the high speed port 111 has permission to access the shared memory bank 330, and setting the semaphore register 310 to 1 may be used to indicate that the low speed port 251 has permission to access the shared memory bank 330. However, this is merely an example, as the semaphore register 310 may be set in an alternate fashion (e.g., 0 to indicate access permission of the low speed port 251 and 1 to indicate access permission of the high speed port 111). Further, the semaphore register 310 may be sized larger than one bit to manage additional high and low speed ports. The semaphore register 310 can be read and written by both the high speed port 111 and the low speed port 251. However, the semaphore register 310 can only be written by the port which currently has access authority. The semaphore register 310 may default to a predefined state (e.g., 1).

The first mailbox register AB 305 may be used to transfer a message from the high speed port 111 to the low speed port 251. The second mailbox register BA 315 may be used to transfer a message from the low speed port 251 to the high speed port 111. The first mailbox register AB 305 can be written by the high speed port 111 and read by the low speed port 251. The first mailbox register AB 305 can be written by the high speed port 111 when a first interrupt signal /INT b is asserted low by the high speed port 111. The second mailbox register BA 315 can be written by the low speed port 251 and read by the high speed port 111. The second mailbox register BA 315 can be written by the low speed port 251 when a second interrupt signal /INT a is asserted low by the low speed port 251. The first and second mailbox registers 305 and 315 may, for example, have a size of 32 bits.

The check registers may include a first check register AB and a second check register BA. The check registers may, for example, have a size of one bit. The first check register AB can be read by the high speed port 111, while the second check register BA can be read by the low speed port 251. The first check register AB may be used to indicate whether the message written to the first mailbox AB 305 by the high speed port 111 is read or not through the low speed port 251. The second check register BA may be used to indicate whether the message written to the second mailbox AB 315 by the low speed port 251 is read or not through the high speed port 111.

The value of the first check register AB may be automatically modified depending on a read or write command issued to the first mailbox register AB 305. For example, when the high speed port 111 issues a write to the first mailbox register AB 305, the first check register AB may be automatically set to 1, and when the low speed port 251 issues a read to the first mail box register AB 305, the first check register AB may be automatically set to 0. The value of the second check register BA may be automatically modified depending on a read or write command issued to the second mailbox register BA 315. For example, when the high speed port 111 issues a read to the second mailbox register BA 315, the second check register BA may be automatically set to 0, and when the low speed port 251 issues a write to the second mailbox register BA 315, the second check register BA may be automatically set to 1. However, the check registers AB and BA may be set in an alternate fashion. The check registers may be predefined to a default state (e.g., 0).

FIGS. 5A-5F illustrate a method of accessing the shared memory bank 330 of FIG. 3 according to an exemplary embodiment of the present invention. In FIGS. 5A-5F a dotted arrow is used to represent a disallowed datapath and a solid arrow is used to represent an allowed datapath.

Figure 5A:
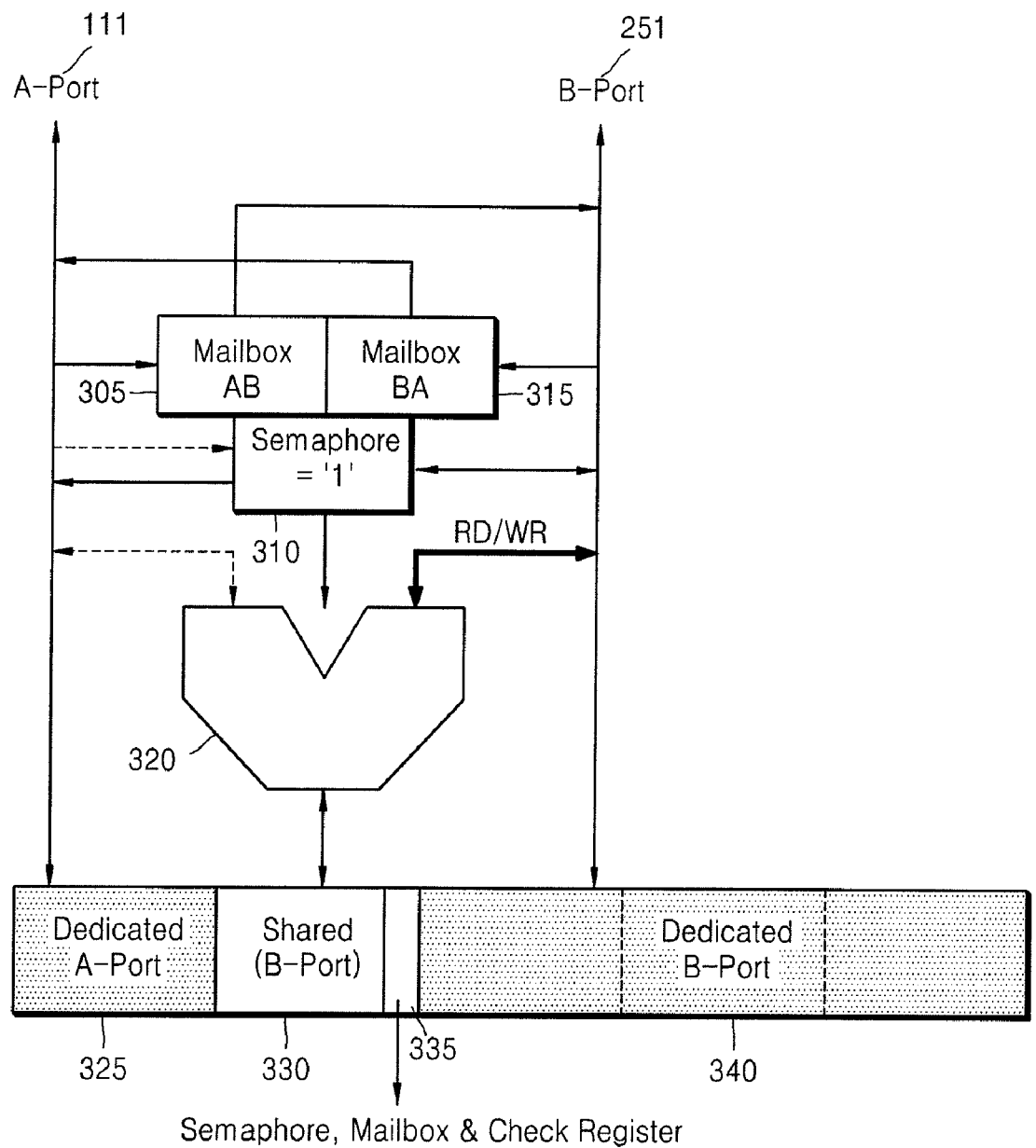
FIGS. 5A-5F illustrate a method of accessing the shared memory bank of FIG. 3 according to an exemplary embodiment of the present invention.

FIG. 5A illustrates an initial step of the method, which may be implemented after power-up. For example, as shown in FIG. 5A, the semaphore register 310 may be set to a default of 1, which may indicate that only the low speed port 251 has access to the shared memory bank 330. The upper left dotted arrow indicates that the high speed port 111 can only read, but cannot write to the semaphore register 310. The lower left dotted arrow indicates that the high speed port 111 cannot read or write data to the multiplexer 320, which prevents access of the high speed port 111 to the shared memory block 330.

Figure 5B:
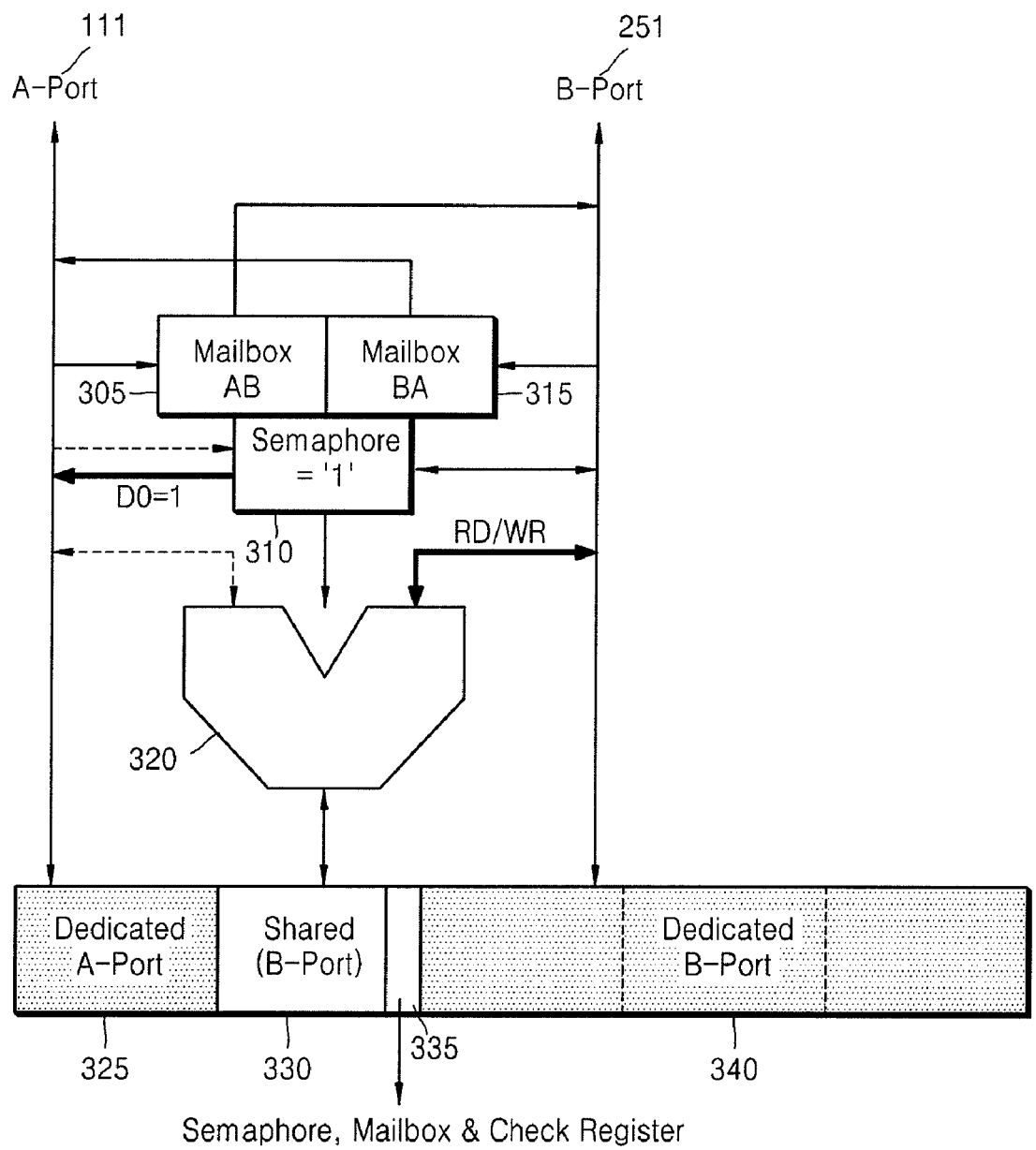

FIG. 5B illustrates a next step of the method where the high speed port 111 reads the semaphore register 310 to determine whether it as access authority to access the shared memory bank 330.

Figure 5C:
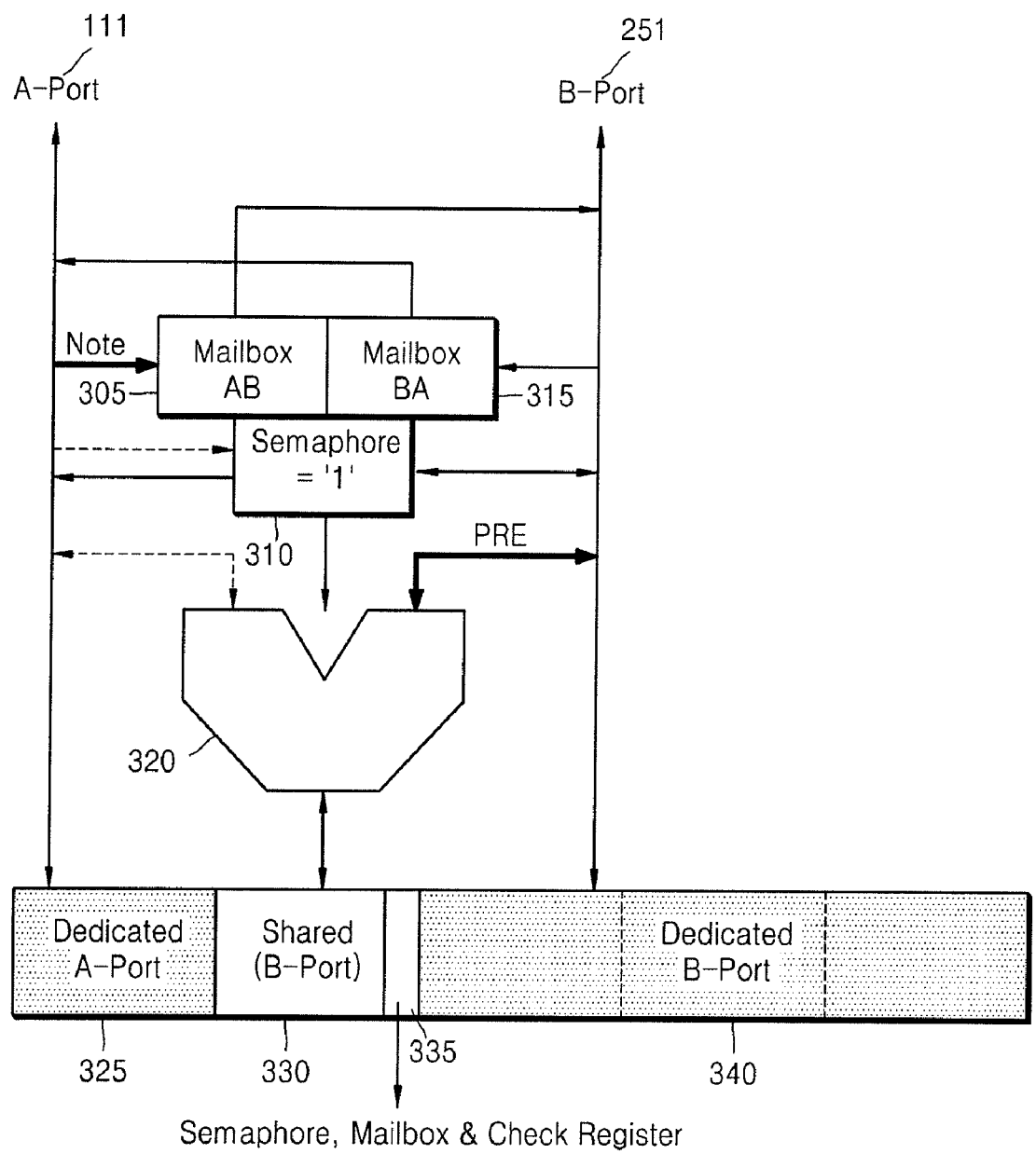

FIG. 5C illustrates a next step of the method where the high speed port 111 sets the first interrupt signal /INT b to a logical low and writes a note to the first mailbox AB. The note indicates that the high speed port 111 desires to access the shared memory bank 330. The solid double ended arrow labeled PRE may indicate that the low speed port 251 is refreshing the shared memory bank 330.

Figure 5D:
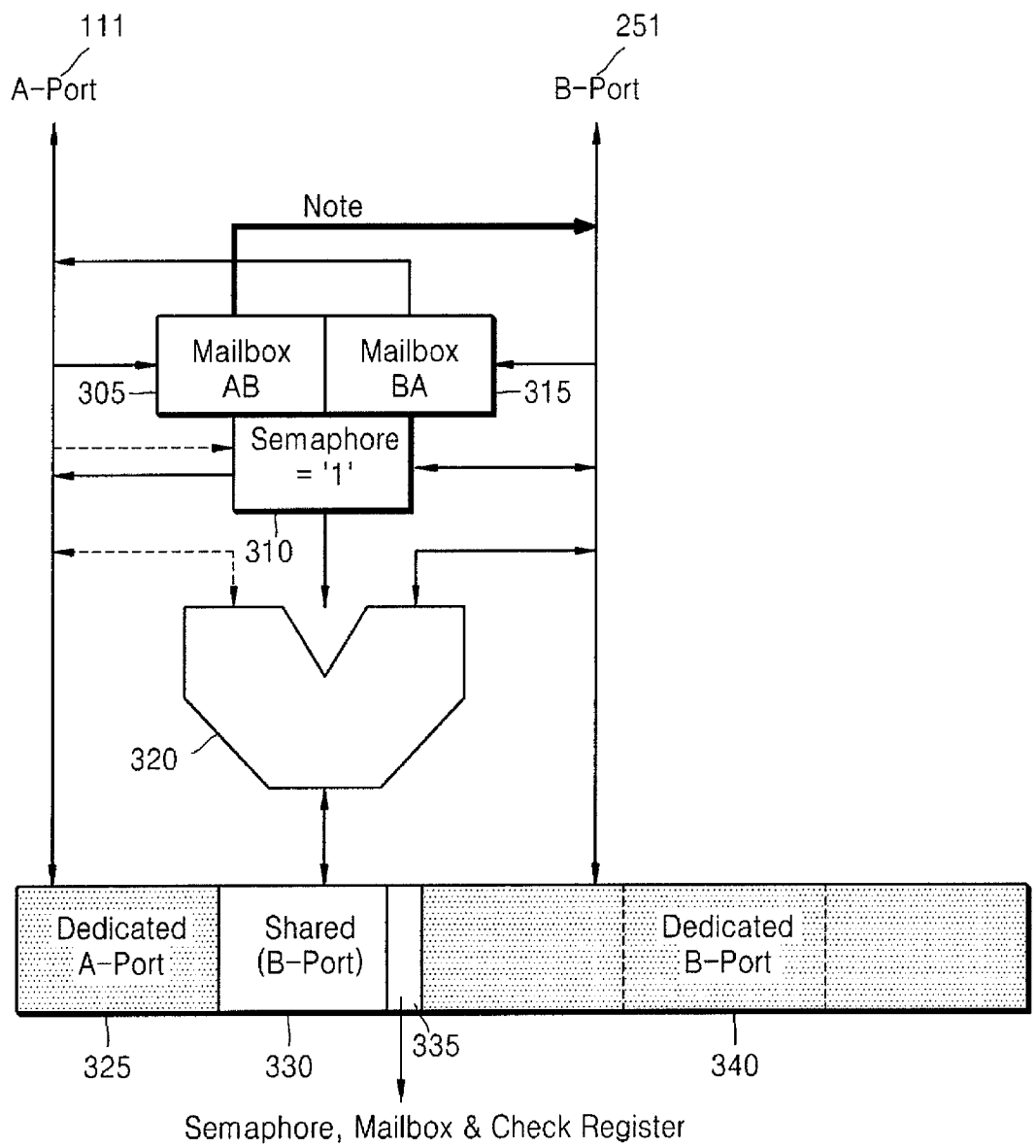

FIG. 5D illustrates a next step of the method where the low speed port 251 sets the first interrupt signal /INT b to a logical high and reads the first mailbox register AB 305 to determine whether the high speed port 111 desires to access the shared memory bank 330.

Figure 5E:
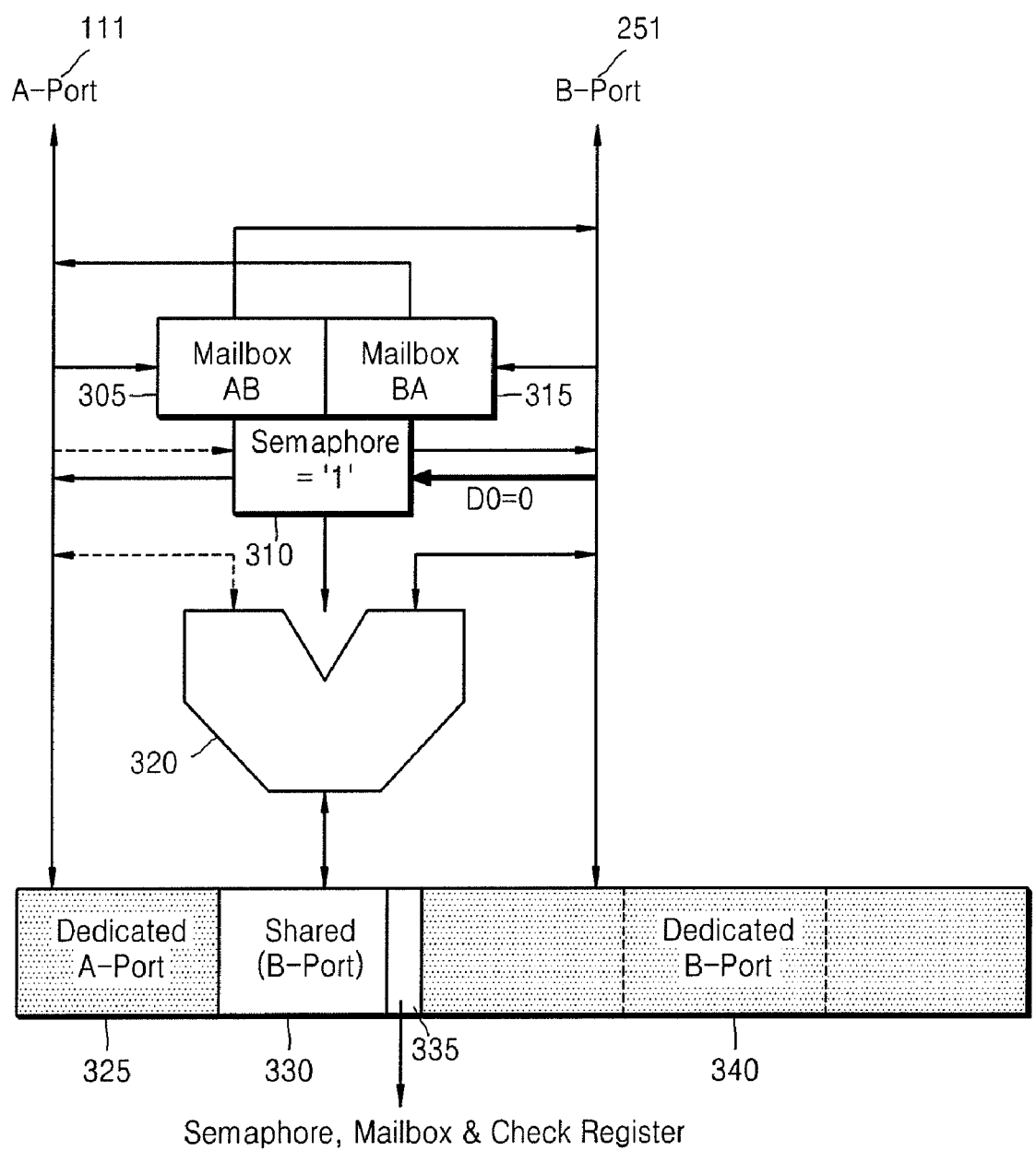

FIG. 5E illustrates a next step of the method where the low speed port 251 writes a 0 to the semaphore register 310 to return access authority to the high speed port 111.

Figure 5F:
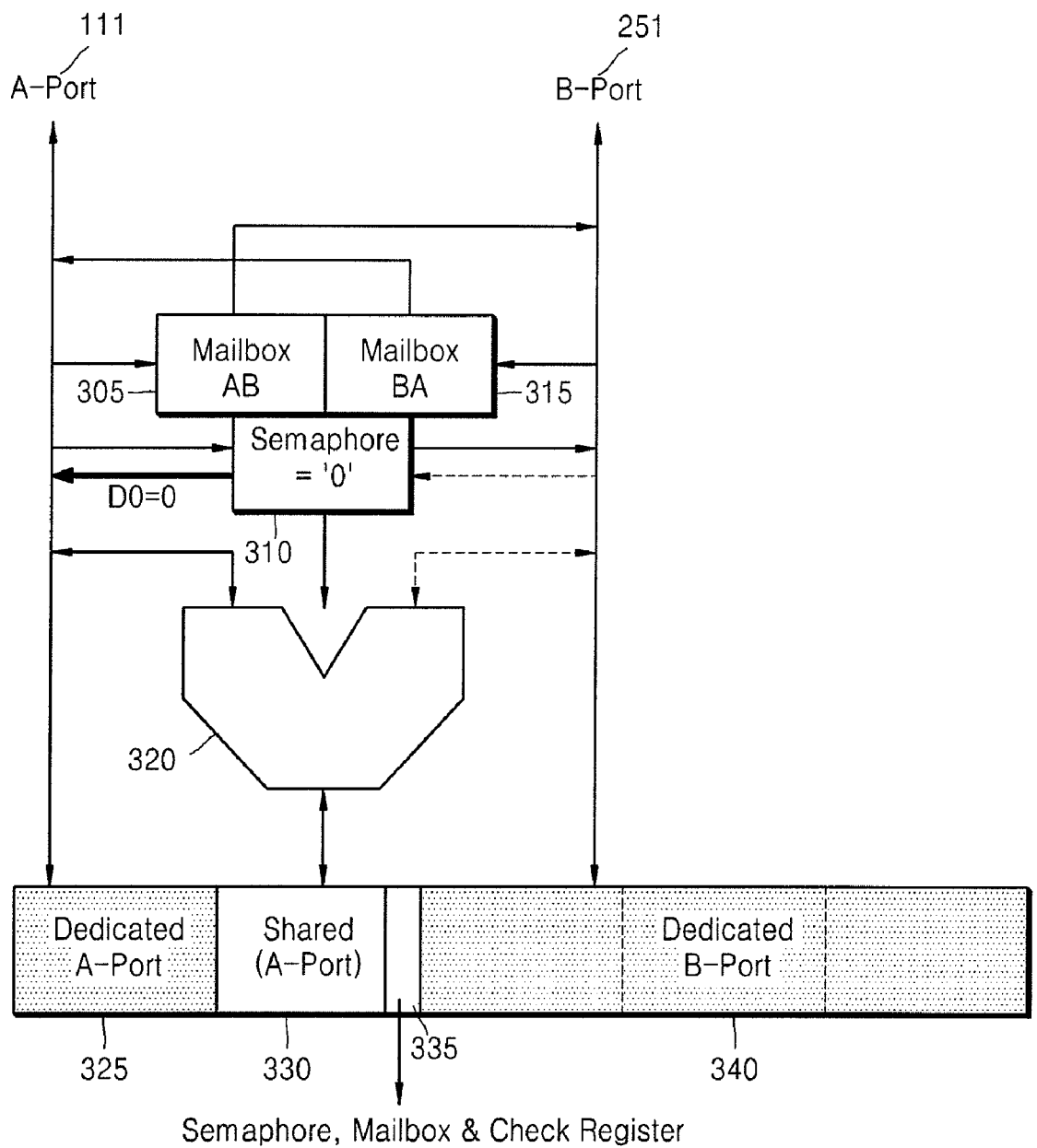

FIG. 5F illustrates a next step of the method where the high speed port 111 reads the semaphore register 310 to determine whether it has permission to access the shared memory bank 330. The high speed port 111 reads that the semaphore register 310 is 0 and accordingly determines that it now has permission to access the shared memory bank 330. As shown by the upper right dotted arrow, the low speed port 251 can now only read, but cannot write to the semaphore register 310. Further, as shown by the lower right dotted arrow, now the low speed port 251 cannot read or write data to the multiplexer 320, which prevents access of the low speed port 251 to the shared memory block 330.

The memory device of FIG. 2 may incorporate the structures of FIG. 3 to arrive at another exemplary embodiment of the present invention. For example, in addition to the high speed port interface (HSP I/F) 110, the data communication block 120, the low speed port interface (LSP I/F) 250, and the operation setting block 130, the memory device may further include at least a first memory bank (e.g., the shared memory bank 330) being shared by the HSP I/F 110 and the LSP I/F 250, a register (e.g., the semaphore register 310) storing information that indicates which one of the port interfaces 110 or 250 has permission to access the first memory bank, and a multiplexer (e.g., the multiplexer 330) connecting one of the HSP I/F 110 or the LSP I/F 250 to the first memory bank, in response to the information stored in the register. The operation setting block 130 can maintain operating setting conditions of the memory device and exchange low speed data with the host through the LSP I/F 250.

The memory device may further include control logic (e.g., the control logic 140) to enable the high speed communication block 120 to exchange high speed data with the host through the HSP I/F 250 and enable the low speed communication block 130 to exchange operating setting conditions of the memory device through the LSP I/F 250.

The port interface having permission to access the first memory bank has permission to change the information of the register. The port interface not having permission does not have permission to change the information of the register. The port interface having permission to access the first memory bank can return permission to the other port interface by changing the information of the register (e.g., see the above described method). The HSP I/F 110 and the LSP I/F 250 have permission to read the information of the register.

The memory device may further include a second register (e.g., the first mailbox register AB 305) to temporally store a message from the high speed port 111 to the low speed port 251. The memory device may further include a third register (e.g., the second mailbox register BA 315) to temporally store a message from the low speed port 251 to the high speed port 111. The data communication block may include one or more functional blocks (e.g., the functional blocks 121) transmitting or receiving data and performing a predetermined operation using the data, a memory cell (e.g., the memory cell 123), and a data interface (e.g., the data interface 122) between the memory cell and the functional block (e.g., the functional blocks 121). The predetermined operation may be one of coding, decoding, conversion of parallel data into serial data, or conversion of serial data into parallel data.

The low speed communication block 130 may process at least one information about an operation mode of the memory device, temperature sensor information, or error flag information about received or transmitted data. The operation setting block 130 may include a PLL (e.g., the PLL 131), a status register (e.g., the status register 133) outputting the operation mode of the memory device and the error flag information about received or transmitted data, and/or a temperature sensor (e.g., the temperature sensor 132) outputting the temperature sensor information.

The HSP I/F 110 may further include a high speed port (e.g., the high speed port 111) and a high speed data input/output circuit (e.g., the high speed data input/output circuit 112) connected to the high speed port, and performing data synchronization between the host and the data communication block 120. The LSP I/F 250 may further include a low speed port (e.g., the low speed port 251) a low speed data input/output circuit (e.g., the low speed data input/output circuit 252) connected to the low speed port, and performing data synchronization between the host and the operation setting block 130. The memory device may be configured to interface with a plurality of hosts.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device comprising:
    a high speed port;
    a low speed port;
    at least a first memory bank being shared by the high speed port and the low speed port;
    a first register storing information, wherein the information indicates which one of the ports has permission to access the first memory bank;
    a multiplexer connecting one of the high speed port or the low speed port to the first memory bank, in response to the information stored in the first register;
    a second memory bank corresponding to the high speed port; and
    a third memory bank corresponding to the low speed port.

2. The memory device as claimed in claim 1, wherein the port having permission to access the first memory bank has permission to change the information of the first register, and the port not having permission does not have permission to change the information of the first register.

3. The memory device as claimed in claim 2, wherein the port having permission to access the first memory bank returns permission to the other port by changing the information of the first register.

4. The memory device as claimed in claim 2, wherein both the high speed port and the low speed port have permission to read the information of the first register.

5. The memory device as claimed in claim 1, further comprising:
    a second register temporally storing a message from the high speed port to the low speed port; and a third register temporally storing a message from the low speed port to the high speed port.

6. A memory device comprising:
a high speed port interface exchanging data with a host at a high speed;
a low speed port interface exchanging data with the host at a low speed;
a data communication block exchanging high speed data with the host through the high speed port interface and low speed data with the host through the low speed port interface;
a operation setting block maintaining operating setting conditions of the memory device;
at least a first memory bank being shared by the high speed port interface and the low speed port interface;
a first register storing information, wherein the information indicates which one of port interfaces has permission to access the first memory bank;
a multiplexer connecting one of the high speed port interface or the low speed port interface to the first memory bank, in response to the information stored in the first register;
a second register temporally storing a message from the high speed port to the low speed port; and
a third register temporally storing a message from the low speed port to the high speed port.

7. The memory device as claimed in claim 6, wherein the port interface having permission to access the first memory bank has permission to change the information of the first register, and the port interface not having permission does not have permission to change the information of the first register.

8. The memory device as claimed in claim 7, wherein the port interface having permission to access the first memory bank returns permission to the other port interface by changing the information of the first register.

9. The memory device as claimed in claim 7, wherein both the high speed port interface and the low speed port interface have permission to read the information of the first register.

10. The memory device of claim 6, wherein the data communication block comprises:
a functional block transmitting or receiving data and performing a predetermined operation using the data;
a memory cell; and
a data interface between the memory cell and the functional block.

11. The memory device of claim 10, wherein the predetermined operation is one of coding, decoding, conversion of parallel data into serial data, or conversion of serial data into parallel data.

12. The memory device of claim 6, wherein the operation setting block processes at least one information about an operation mode of the memory device, temperature sensor information, or error flag information about received or transmitted data.

13. The memory device of claim 12, wherein the operation setting block comprises:
a phase locked loop (PLL);
a status register outputting the operation mode of the memory device and the error flag information about received or transmitted data; and
a temperature sensor outputting the temperature sensor information.

14. The memory device of claim 6, wherein the high speed port interface comprises:
a high speed port; and
a high speed data input/output circuit connected to the high speed port, and performing data synchronization between the host and the data communication block.

15. The memory device of claim 6, wherein the low speed port interface comprises:
a low speed port; and
a low speed data input/output circuit connected to the low speed port, and performing data synchronization between the host and the data communication block.

16. The memory device of claim 6, wherein the memory device is configured to interface with a plurality of hosts.

17. A memory device comprising:
a high speed port;
a low speed port;
at least a first memory bank being shared by the high speed port and the low speed port;
a first register storing information, wherein the information indicates which one of the ports has permission to access the first memory bank;
a multiplexer connecting one of the high speed port or the low speed port to the first memory bank, in response to the information stored in the first register;
a second register temporally storing a message from the high speed port to the low speed port; and
a third register temporally storing a message from the low speed port to the high speed port.

* * * * *